United States Patent [19]

Harward

[11] Patent Number: 5,489,796
[45] Date of Patent: Feb. 6, 1996

[54] INTEGRATED CIRCUIT RESISTOR COMPRISING AMORPHOUS SILICON

[75] Inventor: Mark G. Harward, Dallas, Tex.

[73] Assignee: Texas Instruments Incorporated, Dallas, Tex.

[21] Appl. No.: 369,561

[22] Filed: Jan. 6, 1995

Related U.S. Application Data

[63] Continuation of Ser. No. 182,951, Jan. 18, 1994, abandoned, which is a continuation of Ser. No. 861,211, Mar. 30, 1992, abandoned.

[51] Int. Cl.$^6$ .......................... H01L 27/02; H01L 27/10; H01L 45/00
[52] U.S. Cl. .......................... 257/379; 257/537; 257/904
[58] Field of Search .......................... 257/904, 52, 379, 257/536, 537, 539, 538, 903

[56] References Cited

U.S. PATENT DOCUMENTS

| | | | |
|---|---|---|---|
| 4,755,480 | 7/1988 | Yau et al. | 437/47 |
| 4,914,055 | 4/1990 | Gordon et al. | 437/192 |
| 5,047,826 | 9/1991 | Keller et al. | 257/52 |
| 5,070,383 | 12/1991 | Sinar et al. | 257/537 |

FOREIGN PATENT DOCUMENTS

| | | | |
|---|---|---|---|
| 61-276357 | 12/1986 | Japan | 257/904 |
| 62-241372 | 10/1987 | Japan | 257/752 |
| 1-265558 | 10/1989 | Japan | 257/904 |

OTHER PUBLICATIONS

"Polysilicon Vertical Resistors", S. A. Abbas, IBM Technical Disclosure Bulletin, vol. 23, No. 5, Oct., 1980.
"A Novel Ion–Implanted Amorphous Silicon Programmable Element" Shacham–Diamond et al., International Electron Devices Meeting, 1987, pp. 194–197.
"The Electrical Properties of Ion–Implanted Amorphous Silicon Programmable Element . . . " Shacham–Diamond et al., IEEE Trans./Electron Devices, V. 37, No. 1, Jan. 1990, pp. 159–167.

*Primary Examiner*—Donald L. Monin, Jr.
*Attorney, Agent, or Firm*—Ira S. Matsil; Brian C. McCormack; Richard L. Donaldson

[57] ABSTRACT

The device hereof provides an integrated circuit resistor (34) comprising amorphous or noncrystalline semiconducting material. Further advantages can be gained in area by forming the noncrystalline semiconductor resistor in a nonplanar fashion (i. e. with a vertical construction) wherein a first electrical contact is made to the resistor on its bottom surface and a second electrical contact is made to the resistor on its top surface.

Other devices, systems and methods are also disclosed.

8 Claims, 7 Drawing Sheets

1
INTEGRATED CIRCUIT RESISTOR COMPRISING AMORPHOUS SILICON

This application is a Continuation of application Ser. No. 08/182,951, filed Jan. 18, 1994, now abandoned which is a continuation of Ser. No. 07/861,211, filed on Mar. 30, 1992, now abandoned.

FIELD OF THE INVENTION

This invention generally relates to an integrated circuit resistor comprising amorphous silicon.

BACKGROUND OF THE INVENTION

Heretofore, in this field, resistors have been planar polysilicon resistors. Design of these planar polysilicon resistors is a trade-off of resistance versus processing and circuit layout efficiency. Because of the relatively low resistivity of polysilicon, it is difficult to form relatively high value resistors. To form a relatively high resistance the designer will increase the length or decrease the cross-sectional area of the resistor. Increasing the length of the resistor will require additional wafer surface area to form the resistor. Decreasing the cross-sectional area, defined as the product of film thickness and width, will make processing difficult because variations in film thickness and width will have a larger influence on resistance.

Another method for providing the resistive function is to use active load transistors. The advantage of using active load transistors over using planar resistors is space savings. The difficulty with active loads is they have a limited linear range, require a biasing voltage outside the range of the signal voltage which they act upon, and their area must be significantly increased to pass larger currents.

Within the field of SRAM design, both planar resistors and active loads have been used. In early CMOS (Complementary Metal Oxide Semiconducting) SRAM designs, the six transistor (6T) memory cell design was used. This design consists of two cross-coupled n-channel transistors each with an associated active load p-channel transistor. This design also has two n-channel pass transistors for gating of the signals in or out of the cross-coupled memory cell for a total of six transistors. The difficulty with this design is the relatively large amount of wafer area needed for the six transistors. A further difficulty is the need for n-well regions to be formed within the bulk p-type material in order to fabricate the p-channel transistors. The boundary of n-well and p-well requires costly spacing to diffusions to prevent the creation of horizontal SCRs which are latch-up sensitive.

More recently, SRAM cell designs have migrated to 4 transistor cell designs which use polysilicon pull-up resistors. This design is referred to as the 4T-2R SRAM memory cell. This design uses less wafer area, but difficulties arise in keeping the polysilicon pull-up resistance sufficiently high for low power consumption. The design of the polysilicon resistors is a trade-off between wafer area, power consumption, and producibility.

Because of this difficult design trade-off, the industry has pursued stacked memory structures in which a thin film p-channel load transistor may be deposited above its associated n-channel transistor. In this manner, a three dimensional circuit fabrication has been effected. While this accomplishes a very small wafer area usage, it requires a great number of process steps. Other difficulties involve improving the grain size of the polysilicon crystal, and maintaining reproducible device parameters.

2
SUMMARY OF THE INVENTION

The problem outlined above is in large measure solved by the integrated circuit resistor of the present invention. That is to say, the device hereof provides an integrated circuit resistor comprising amorphous or noncrystalline semiconducting material. By using a noncrystalline semiconducting material for an integrated circuit resistor, one can obtain a wide range of material resistivity determined by doping level, annealing time and annealing temperature. Resistivity is a strong function of annealing time and temperature as long as the processing temperature remains low enough for the semiconductor to remain in the noncrystalline state. By using noncrystalline semiconductor with relatively high resistivity instead of a crystalline or polycrystalline semiconductor, one can avoid the high wafer area usage associated with the formation of high value resistors or active load transistors.

Further advantages can be gained in area by forming the noncrystalline semiconductor resistor in a non-planar fashion (i.e. with a vertical construction) wherein a first electrical contact is made to the resistor on its bottom surface and a second electrical contact is made to the resistor on its top surface. This construction, but using polycrystalline silicon, was disclosed by S. A. Abbas in the IBM Technical Disclosure Bulletin of October 1980 as a possible application enabled at the time by the capabilities of reactive ion etching. The present invention, however, is the first to disclose use of amorphous silicon constructions which enable resistors having a much higher resistance to be formed within an equivalent area when compared to polysilicon. The use of doped amorphous silicon further allows greater flexibility in the range of resistivity by varying the dopant concentration and annealing parameters.

Preferably, the noncrystalline semiconductor resistor comprises noncrystalline silicon with impurities such as boron or phosphorous added thereto.

Amorphous silicon resistors can be used to the advantage of many integrated circuit technologies. The preferred embodiment of this invention is a four transistor, two resistor (4T-2R SRAM) memory cell which has been common for many years in static memory cell design. In prior art 4T-2R memory cells the wafer area consumed by the two planar polysilicon resistors have been an issue of concern when defining the circuit layout. In prior art 6T memory cells the wafer area consumed by the two active load pull-up resistors have been an issue of concern when defining the circuit layout also. The preferred embodiment of the present invention enables the cell area of a 4T-2R to be decreased, while maintaining a high resistance, by replacing the planar polysilicon resistors or active load transistors with amorphous or noncrystalline resistors. The present invention allows this to be accomplished without the corresponding increase in process steps and difficulties associated with a stacked 6T design using thin film transistors. In the preferred embodiment, these amorphous resistors are vertical, doped amorphous silicon resistors.

Further embodiments illustrated in the present invention include a single transistor inverter, an ECL or/nor/inverter, and a Bi-CMOS inverter. Preferably these embodiments comprise vertical, doped amorphous silicon resistors.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
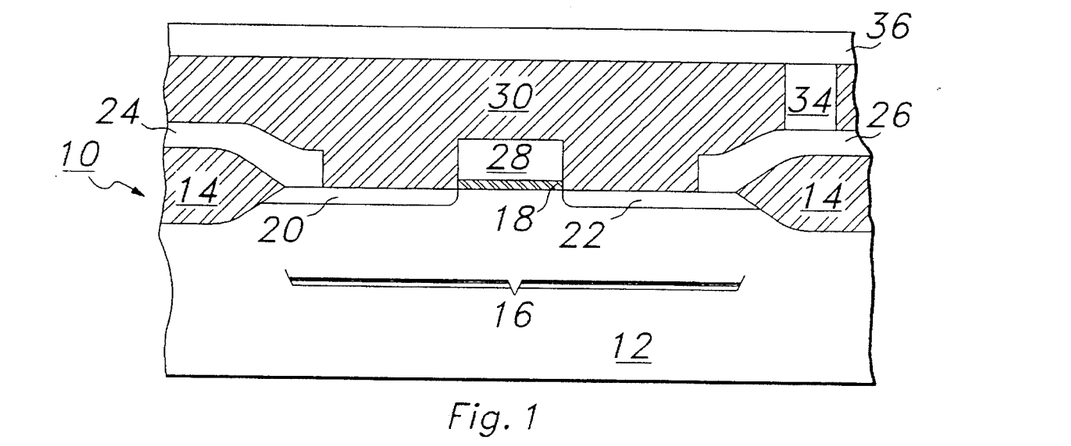
FIG. 1, in partial cross section, illustrates the preferred embodiment of the present invention.

Referring now to the present invention and FIG. 1 in particular, a microelectronic device 10, incorporating a vertical amorphous silicon resistor in accordance with the preferred embodiment of the present invention, is partially depicted. Device 10 includes a substrate 12, a field oxide 14 encompassing and defining a moat region 16. Device 10 further includes a gate oxide 18, a polysilicon gate 28, implanted source/drain regions 20, 22, and a first conductive layer which forms discrete connections to different circuit elements and in this instance comprising a first conductor 24 electrically connected to source region 20 and a second conductor 26, not in electrical communication with the first conductor 24, electrically connected to drain region 22. Further patterned from the first conductive layer is gate 28 which overlies gate oxide 18. Device 10 further includes an interlevel oxide (ILO) 30, and an ILO opening 32 (not shown in this figure, refer to FIG. 3c). In the preferred embodiment of the present invention, an amorphous silicon resistor 34 is formed within this ILO opening 32. The resistor 34 is in electrical communication with second conductor 26. Device 10 also includes a second conductive layer 36 also in electrical communication with resistor 34, but formed with the resistor 34 interposed between the second conductor 26 and second conductive layer 36 such that a resistance R is formed between second conductor 26 and second conductive layer 36.

Preferably, the first conductive layer which is patterned to form first and second conductors 24 and 26 is formed from highly doped polycrystalline silicon, although a metal such as aluminum could be used. Furthermore, in the preferred embodiment a titanium tungsten alloy (not shown) may be interposed between the second conductor 26 and the resistor 34 to act as a barrier to the polycrystalline material of the second conductor 26 acting as a seed crystal and contributing to undesired crystallization of 34. If the first conductive layer is a metal, then preferably this titanium tungsten alloy would be formed adjacent to the resistor 34 as a part of a multilayer metal deposition with the metal. The titanium tungsten alloy serves in this manner to avoid contact problems associated with excessive metal hillock formation or electromigration. Preferably, the resistor 34 is doped, noncrystalline silicon, although other noncrystalline semiconductors such as germanium or gallium arsenide could be substituted. The dopant used for resistor 34 is preferably phosphorous, but boron, arsenic, or another dopant may be substituted. Further, the resistor 34 may be undoped. The second conductive layer 36 is preferably a metal such as aluminum deposited in a multilayer metal deposition with a titanium tungsten alloy adjacent to the resistor 34 to avoid contact problems associated with excessive metal hillock formation or electromigration.

Although device 10 is illustrated as an MOSFET, the inventive resistor could be used in any application requiring such an element, such as in, by way of example but not limited to, TTL, ECL, or Bi-CMOS.

Figure 2:
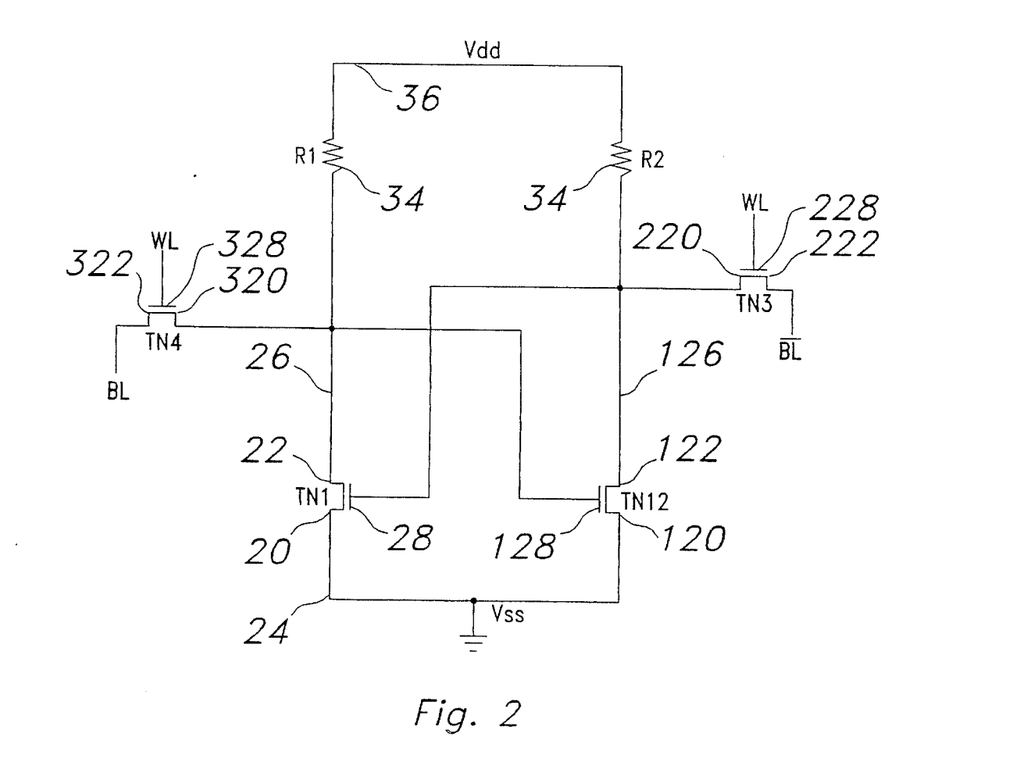
FIG. 2 schematically illustrates a 4T-2R SRAM cell and associated circuitry incorporated in the preferred embodiment of the present invention.

Referring now to FIG. 2, comparison of FIG. 2 to FIG. 1 will help to reveal the portion of the MOSFET structure depicted in FIG. 1 within the application of a 4T-2R SRAM cell. By reference to FIG. 2, moat 16 is the drain/source region of a transistor TN1, source 20 is the source region of transistor TN1, drain 22 is the drain region of transistor TN1, gate 28 is the gate of transistor TN1, first conductor 24 is patterned to form the V, conductor and second conductor 26 is patterned to form an electrical connection from drain region 22 to resistor 34. Second conductor 26 is in further electrical communication with the gate 128 of a second transistor TN2. Transistors TN2, TN3, and TN4 are of similar structure to first transistor TN1. Resistor 134 is the pull-up resistor R2. The functional operation of the circuitry of the 4T-2R is well known to those skilled in the art of logic circuit design.

Figure 3A:
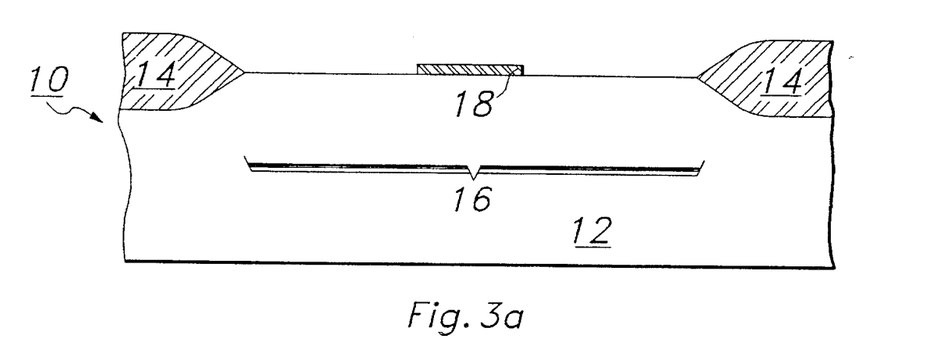
FIGS. 3a–3e, in partial cross section, illustrate progressive steps in the formation of a microelectronic device in accordance with the present invention.

Referring now to FIG. 3a the formation of device 10 will now be described. Substrate 12 is typically formed of a monocrystalline silicon wafer. Substrate 12 is formed so as to include a field oxide 14. Substrate 12 further includes a gate oxide 18, and a moat 16.

Figure 3B:
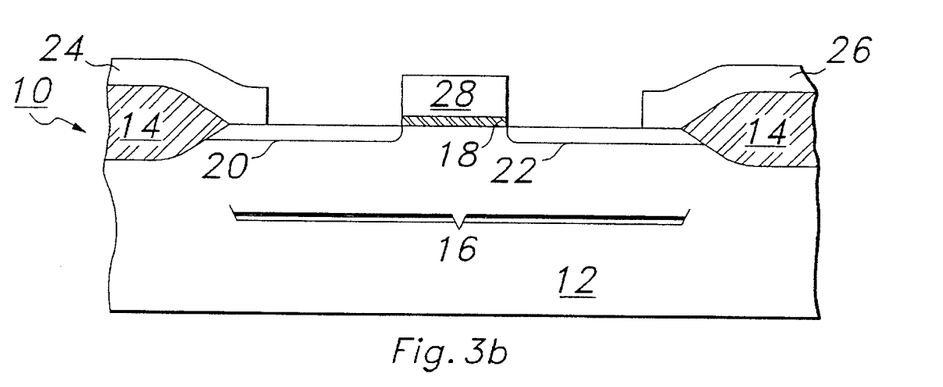

Referring to FIG. 3b, a first conductive layer is formed and patterned to form discrete connections to different circuit elements and in this instance comprising a first conductor 24 electrically connected to source region 20 and a second conductor 26, not in electrical communication with the first conductor 24, electrically connected to drain region 22. Further patterned from the first conductive layer is gate 28 which overlies gate oxide 18. Moat 16 is now selectively doped to form a source region 20 and a drain region 22 on opposing sides of and adjacent to the gate 28 and encompassed by field oxide 14.

Figure 3C:
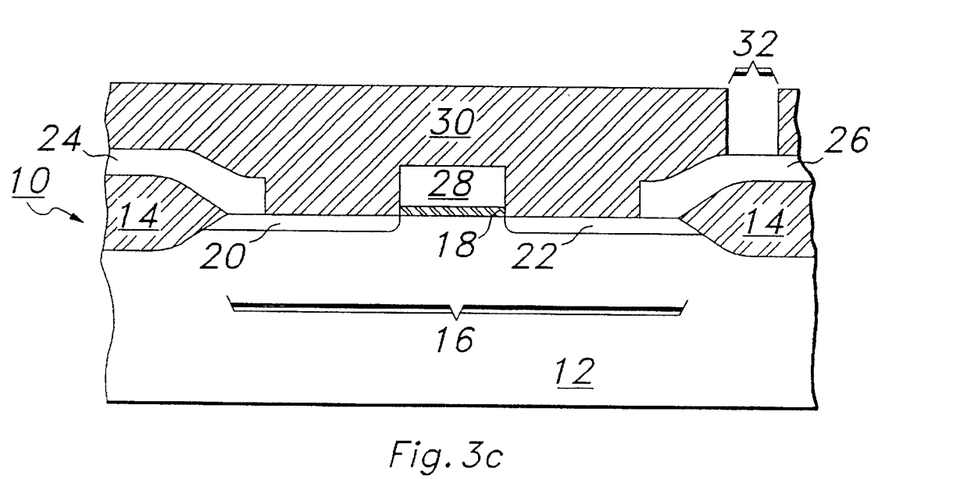

Referring to FIG. 3c, first interlevel oxide is deposited over the wafer. A cavity 32 is patterned in the interlevel oxide above the second conductor 26 such that an area of second conductor 26 is exposed. Cavity 32 has a cross sectional area, generally defined as the surface area of the portion of second conductor 26 exposed by cavity 32, which will define the cross sectional area of resistor 34.

Figure 3D:
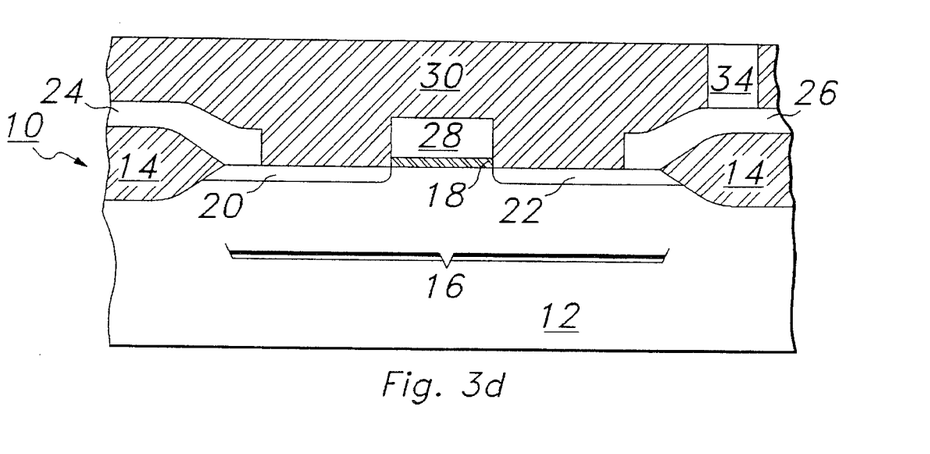

Referring now to FIG. 3d, an amorphous semiconductor material 34 is deposited over the wafer surface and is generally removed from areas not overlying cavity 32. This deposition process typically is a LPCVD process including in situ doping as is well known in the art. Silicon is often initially deposited in its amorphous or noncrystalline state in the same manner as this, but is always annealed at high temperature to crystallize as a polysilicon before use as a resistor. This is the first use of the silicon in its amorphous state to form a vertical resistor. The selective removal of the amorphous semiconductor material is typically accomplished using an etch selective to the amorphous material over the interlevel oxide. Alternatively, an epitaxial semiconductor layer could be deposited within the cavity 32, and by using impurity bombardment to damage the crystalline structure an amorphous semiconductor resistor 34 could be formed. Although the resistor 34 is shown to be flush with the top of interlevel oxide 30, the resistor material surface could fall below the surface of oxide 30, or its surface could lie above the plane of the oxide 30. In order to preserve noncrystallinity of the amorphous semiconductor subsequent processing temperature should be preferably kept below about 500° C., although any method of preserving the noncrystallinity of the amorphous resistor 34 is appropriate. The maximum processing temperature to preserve the noncrystallinity for an in situ doped amorphous semiconductor is well defined but is dependent on many variables. For example, refer to Sze, *VLSI Technology*, 2nd Edition, pp 243–244. These variables include deposition rate, partial pressure of hydrogen, total pressure, presence of dopants, and presence of impurities. After deposition, polysilicon may recrystallize when heated, but the amorphous structure can be stable to temperatures of 1000° C. or higher depending on the presence of dopants and impurities.

Still referring to FIG. 3d, the amorphous semiconductor resistor may be doped, using a method well known in the art, to lower the conductivity of the amorphous material. Initially amorphous silicon material has a resistivity on the order of $10^{12}$ $\Omega$-cm. A typical cavity depth might be on the order of 0.1 μm, and a typical cross sectional area might be 1 μm$^2$. Since the resistance R=ρL/A Ω, where L is the cavity depth (0.1 μm), A is the cross sectional area (1 μm$^2$), and ρ is the resistivity ($10^{12}$ $\Omega$-cm), then a typical undoped resistor 34 will be $10^{15}$ Ω. This resistance is too high for typical logic circuits, but is in the range needed for a 4T-2R memory cell where the resistor provides for leakage current and charge lost due to alpha particle hits. If implementation in NMOS logic, for example, is desired, then the amorphous semiconductor may be doped. Sze shows that in situ phosphorous-doped silicon deposited at 575° C. with a concentration of $10^{20}$ to $10^{21}$ cm$^{-3}$ possesses a resistivity of 100 $\Omega$/-cm. Using the above physical structure of a typical cavity depth on the order of 0.1 μm, and a typical cross sectional area of 1 μm$^2$ and again using R=ρL/A Ω, where L is the cavity depth (0.1 μm), A is the cross sectional area (1 μm$^2$), and ρ is the resistivity (100 Ω-cm), then the resistor 34 would be 1000 Ω. Further reference to Sze reveals the great deal of variation of resistivity that can be accomplished by varying the doping parameters of in situ deposited amorphous silicon. For example, when the ratio of dopant phosphine $PH_3$ to silane $SiH_4$ is varied from $10^{-4}$ to $10^{-1}$ at a 600° C. deposition temperature (note that because this is a phosphorous-doped silicon film that deposition at 600° C. will still be an amorphous deposition), the resistivity of the deposited silicon varies from about $10^4$ $\Omega$-cm to about $10^{-2}$ $\Omega$-cm. This extreme flexibility in resistivity is another advantage of using amorphous semiconductor resistors.

Figure 3E:
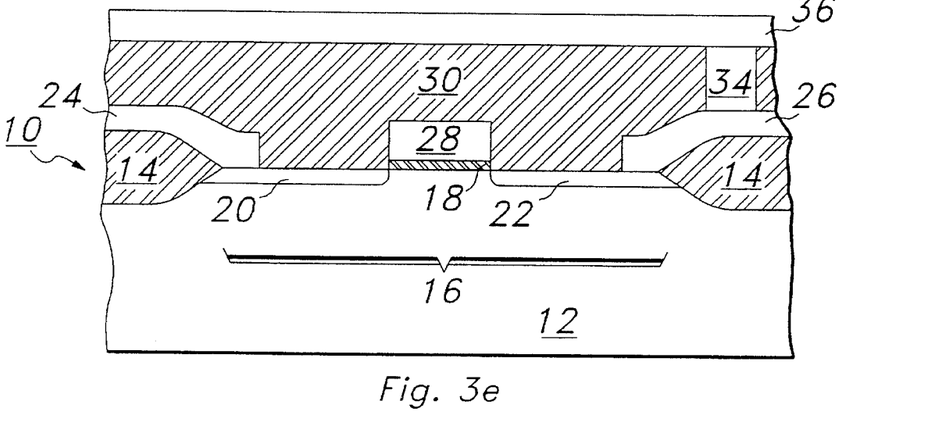

Now referring to FIG. 3e, a second conductive layer is formed over the interlevel oxide and overlying and in electrical communication with resistor 34 such that resistor 34 forms a resistance, R, between second conductor 26 and second conductive layer 36. Preferably second conductive layer is aluminum with a layer of titanium tungsten alloy interposed between resistor 34 and aluminum. The titanium tungsten alloy serves to avoid contact problems associated with excessive aluminum hillock formation or aluminum electromigration.

Referring now to FIGS. 4a–4e a typical plan view layout of a single 4T-2R SRAM cell is shown in different stages of processing. In an actual memory devices many thousands of these devices would be connected in an array. This layout is exemplary, and can be optimized by one skilled in the art of integrated circuit design.

Figure 4A:
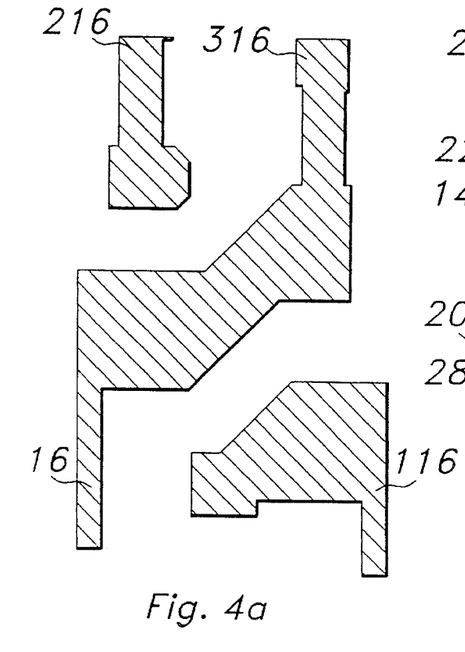
FIGS. 4a–4d, shows a plan view of a single 4T-2R SRAM cell, and is an exemplary layout of the preferred embodiment of the present invention during progressive steps of its formation.

In reference to FIG. 4a, moat regions 16, 116, 216 and 316 are defined in the substrate 12 a field oxide. Moat region 16 and moat region 316 are generally the same region as shown. The MOSFET structure will be clearly illustrated in following figures.

Figure 4B:
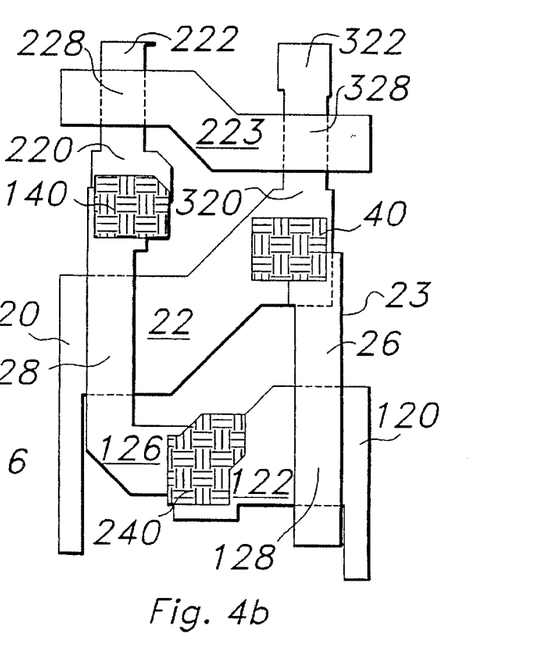

Referring now to FIG. 4b, first conductive layers 23, 123, and 223 are formed over a gate oxide layer (not shown). In areas where the conductive layers overly the moat regions, the conductive layers will act as MOSFET gates 28, 128, 228, and 328. The wafer will now be diffused using the field oxide and the conductive layers as masks, forming a source region 20 and a drain region 22 in moat region 16 on opposing sides of gate 28 forming a first transistor TN1. Correspondingly source regions 120, 220, and 320, and drain regions 122, 222, and 322 on opposing sides of gates 128, 228, and 328 forming a second TN2, third TN3 and fourth transistor TN4. The transistors TN1, TN2, TN3, and TN4 will be connected at butted contacts 40, 140, and 240 as shown in FIG. 4b. This structure compares to FIG. 1 and FIG. 2, although not all transistors will have all the features shown in FIGS. 1 and 2. For example, in FIG. 4b, no first conductor 24 is shown because connection to neighboring memory cells can be made by sharing a common source diffusion region. The structure shown in FIG. 1 may be thought of as more general, although connection of this node to ground potential may be effected by a number of methods well known in the art such as a polysilicon connection or a contact via through interlevel oxide 30 and metal conductor deposition of the ground circuit. Conductor 26 is shown in FIG. 4b, and in this instance conductor 26 also serves as 128. In the same fashion, conductor 126 is shown, and this conductor also serves as gate 28 and conductor 224.

Figure 4C:
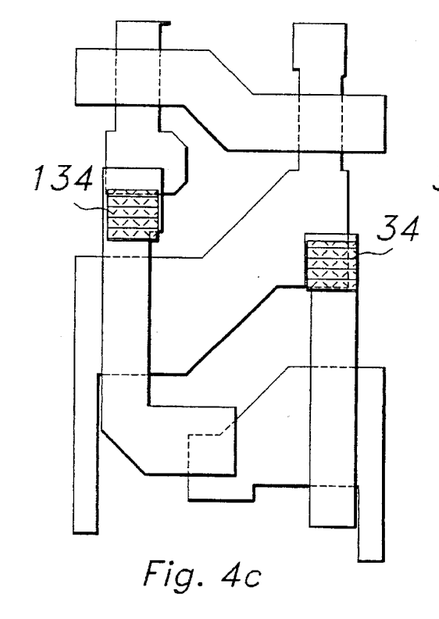

Referring now to FIG. 4c, the resistors 34 and 134 are now formed on conductors 26 and 126 respectively. The interlevel oxide 30 is not shown.

Figure 4D:
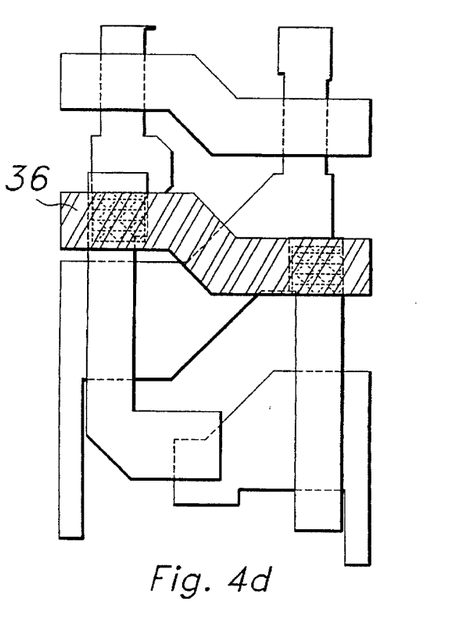

Referring to FIG. 4d, second conductive layer 36 is formed to connect the pull-up resistors 34 and 134 to $V_{dd}$.

Figure 4E:
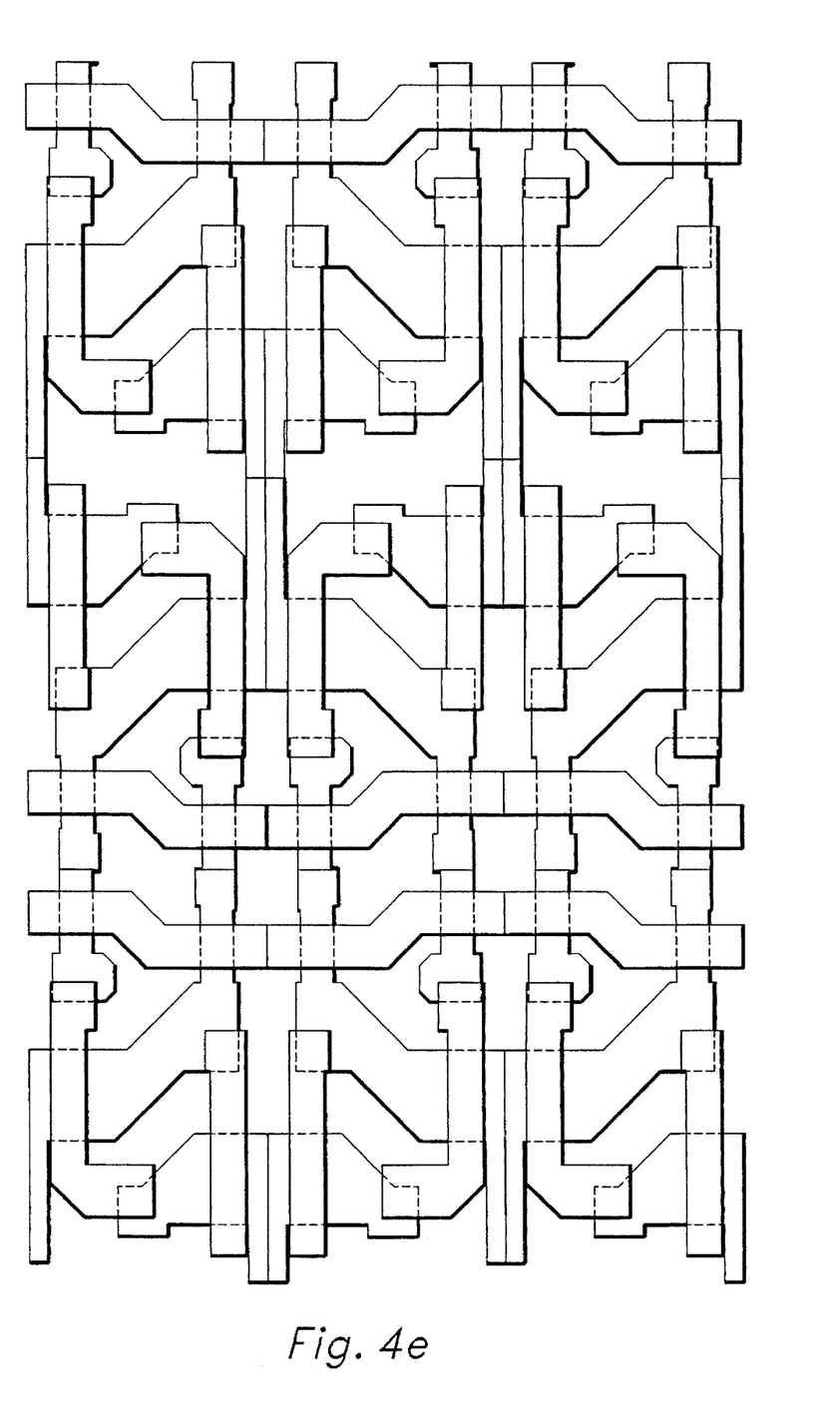
FIG. 4e is an illustrative layout of a small matrix of SRAM cells.

Referring now to FIG. 4e, an illustrative view of a matrix of cells of a 4T-2R SRAM is shown.

The structure of the MOSFET transistor described above is merely exemplary. Many methods and structures for formation of a MOSFET transistor are known in the art. A method for forming an elevated drain source MOSFET is disclosed in U.S. patent application No. 609,969, filed Nov. 6, 1990, which is hereby incorporated by reference. It can be easily seen by those skilled in the art that the amorphous silicon resistor can be applied to numerous methods and structures in the art of integrated circuits without departure from the spirit and scope of this invention.

Figure 5:
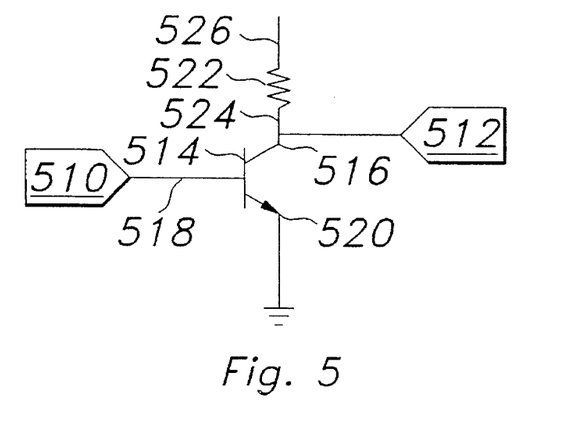
FIG. 5, is a schematic of a single transistor inverter, and illustrates another embodiment of the present invention.

Referring now to FIG. 5, another embodiment of the current invention in a single transistor inverter is schematically illustrated. This embodiment comprises an input 510, an output 512, a transistor 514 having a first terminal 516, a second terminal 518, and a third terminal 520, the first terminal 516 being coupled to the output 512, and the second terminal being coupled to the input 510. This embodiment further comprises a noncrystalline silicon resistor 522 having a first terminal 524 and a second terminal 526, the first terminal 524 being connected to the first terminal 516 of the transistor 514.

Figure 6:
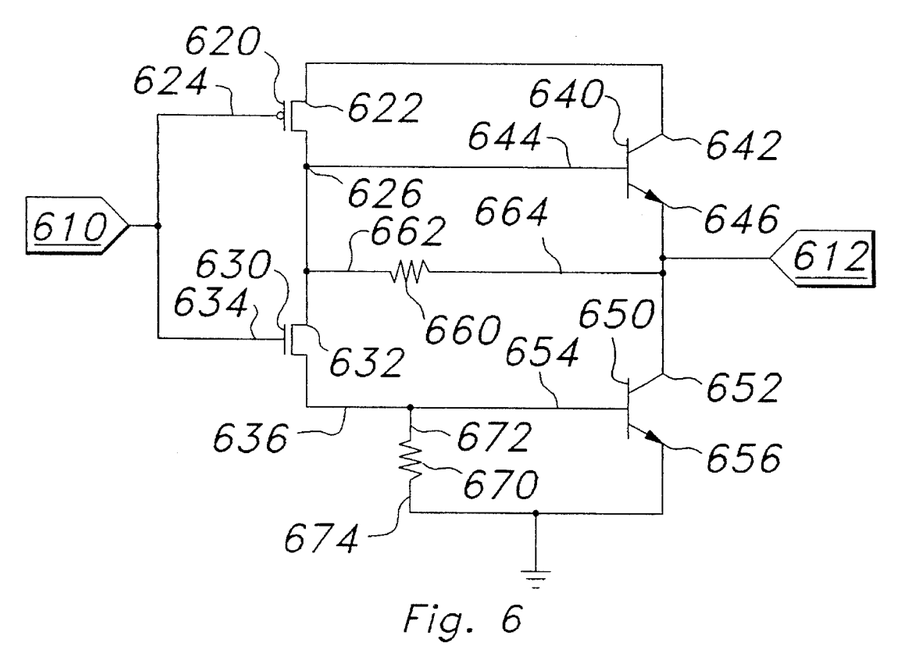
FIG. 6, is a schematic of an ECL or/nor/inverter, and illustrates another embodiment of the present invention.

Referring now to FIG. 6, another embodiment of the current invention in a "full rail" Bi-CMOS inverter is schematically illustrated. The "full rail" designation indicates that the circuit is capable of very nearly driving the output to the supply voltages. This embodiment comprises an input 610, an output 612, a PMOS transistor 620 having a first terminal 622, second terminal 624, and third terminal 626, the second terminal 624 being connected to the input 610. This embodiment further comprises an NMOS transistor 630 having a first terminal 632, second terminal 634, and third terminal 636, the second terminal 634 being connected to the input 610 and the first terminal 632 being connected to the third terminal 626 of the PMOS transistor 620. This embodiment further comprises a first NPN transistor 640 having a first terminal 642, second terminal 644, and third terminal 646, the first terminal 642 being connected to the first terminal 622 of the PMOS transistor 620, the second terminal 644 being connected to the third terminal 626 of the PMOS transistor 620, and the third terminal 646 being connected to the output 612. This embodiment further comprises a second NPN transistor 650 having a first terminal 652, second terminal 654, and third terminal 656, the first terminal 652 being connected to the output 612, and the second terminal 654 being connected to the third terminal 636 of the NMOS transistor 630. This embodiment further comprises a first noncrystalline silicon resistor 660 having a first terminal 662 and a second terminal 664, the first terminal 662 being connected to the third terminal 626 of the PMOS transistor 620, and the second terminal 664 being connected to the output 612, and a second noncrystalline silicon resistor 670 having a first terminal 672 and a second terminal 674, the first terminal 672 being connected to the third terminal 636 of the NMOS transistor 630, and the second terminal 674 being connected to the third terminal 656 of the second NPN transistor 650. The advantage of this embodiment over prior art devices is the ability to have "full rail" output capabilities with minimal wafer area usage. Prior art devices use additional transistors, planar polysilicon resistors, or resistive interconnects which require additional wafer area be allocated.

Figure 7:
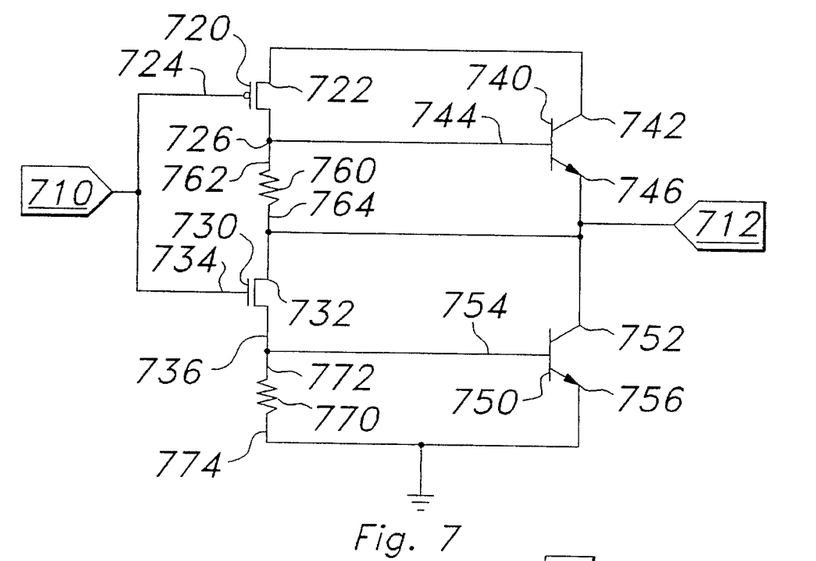
FIG. 7, is a schematic of a Bi-CMOS inverter, and illustrates another embodiment of the present invention.

Referring now to FIG. 7, another embodiment of the current invention in a Bi-CMOS inverter is schematically illustrated. The "full rail" designation indicates that the circuit is capable of very nearly driving the output to the supply voltages. This embodiment comprises an input 710, an output 712, a PMOS transistor 720 having a first terminal 722, second terminal 724, and third terminal 726, the second terminal 724 being connected to the input 710. This embodiment further comprises an NMOS transistor 730 having a first terminal 732, second terminal 734, and third terminal 736, the first terminal 732 being connected to the output 712 and the second terminal 734 being connected to the input 710. This embodiment further comprises a first NPN transistor 740 having a first terminal 742, second terminal 744, and third terminal 746, the first terminal 742 being connected to the first terminal 722 of the PMOS transistor 720, the second terminal 744 being connected to the third terminal 726 of the PMOS transistor 720, and the third terminal 746 being connected to the output 712; and a second NPN transistor 750 having a first terminal 752, second terminal 754, and third terminal 756, the first terminal 752 being connected to the output 712, and the second terminal 754 being connected to the third terminal 736 of the NMOS transistor 730. This embodiment further comprises a first noncrystalline silicon resistor 760 having a first terminal 762 and a second terminal 764, the first terminal 762 being connected to the third terminal 726 of the PMOS transistor 720, and the second terminal 764 being connected to the output 712, and a second noncrystalline silicon resistor 770 having a first terminal 772 and a second terminal 774, the first terminal 772 being connected to the third terminal 736 of the NMOS transistor 730, and the second terminal 774 being connected to the third terminal 756 of the second NPN transistor 750. The advantage of this embodiment over prior art devices is the ability to have "full rail" output capabilities with minimal wafer area usage. Prior art devices use additional transistors, planar polysilicon resistors, or resistive interconnects which require additional wafer area be allocated.

Figure 8:
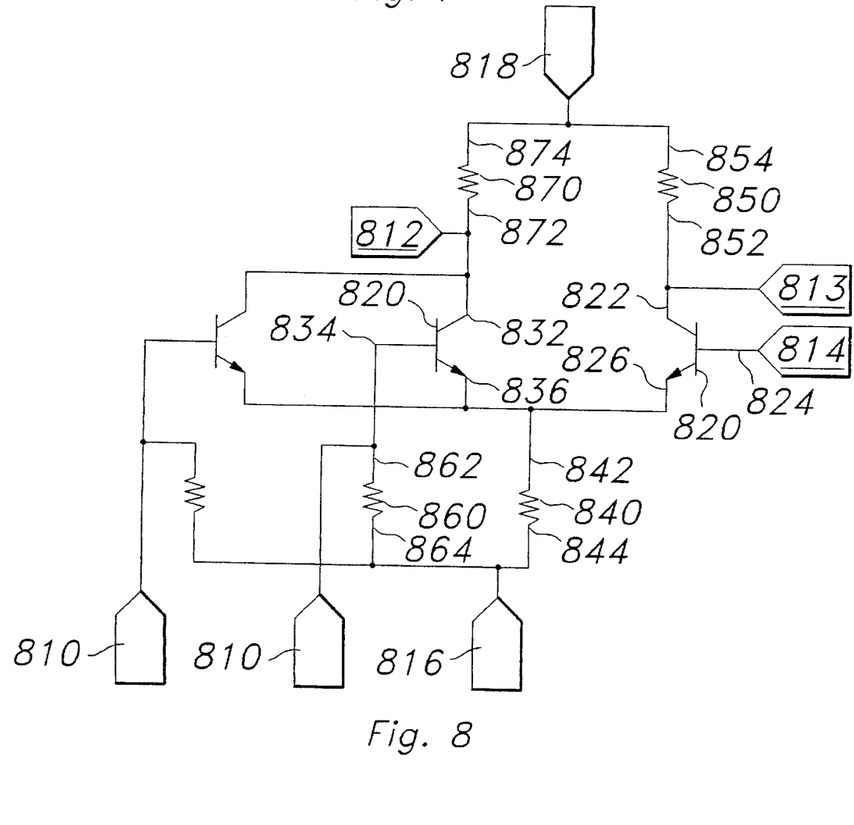
FIG. 8, is alternative schematic of a Bi-CMOS inverter, and illustrates yet another embodiment of the present invention.

Referring now to FIG. 8, another embodiment of the current invention in an ECL or/nor/inverter is schematically illustrated. This embodiment comprises one or more inputs 810, an output 812, a second output 813, a first reference voltage 814, a second reference voltage 816, and a third reference voltage 818. This invention further comprises a first NPN transistor 820 having a first terminal 822, a second terminal 824, and a third terminal 826, the first terminal 822 being connected to the second output 813, and the second terminal 824 being connected the first reference voltage 814. This embodiment further comprises one or more additional NPN transistors 830 having a first terminal 832, a second terminal 834, and a third terminal 836, the first terminal 832 being connected to the first output 812, the second terminal 834 being connected the input 810, and the third terminal 836 being connected to the third terminal 826 of the first NPN transistor 820. This embodiment further comprises a first noncrystalline resistor 840 having a first terminal 842 and a second terminal 844, the first terminal 842 being connected to the third terminal 826 of the first NPN transistor 820, and the second terminal 844 being connected to a second reference voltage 816 which is less than the first reference voltage 814. This embodiment further comprises a second noncrystalline resistor 850 having a first terminal 852 and a second terminal 854, the first terminal 852 being connected to the first terminal of the first NPN transistor 820, and the second terminal 854 being connected to a third reference voltage 818 which is greater than the first reference voltage 814. This embodiment further comprises a third noncrystalline resistors 860 having a first terminal 862 and a second terminal 864, the first terminal 862 being connected to the first terminal 832 of the additional NPN transistor 830 and the second terminal 864 being connected to a third reference voltage 818 which is greater than the first reference voltage 814. This embodiment still further comprises one or more additional noncrystalline resistors 870 having a first terminal 872 and a second terminal 874, the first terminal 872 being connected to the second terminal 834 of the additional NPN transistor 830 and the second terminal 874 being connected to a second reference voltage 816 which is less than the first reference voltage 814. The advantage of this embodiment over prior art devices is the use of amorphous silicon resistors which require less area to implement the same resistance. As can be seen from FIG. 8, resistors are key components in ECL design, so this can be a significant advantage.

A few preferred embodiments have been described in detail hereinabove. It is to be understood that the scope of the invention also comprehends embodiments different from those described, yet within the scope of the claims. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a) an input;
   b) an output;
   c) a transistor having a first, a second, and a third terminal, said first terminal being coupled to said output, said second terminal being coupled to said input, and said third terminal being coupled to a first bias voltage; and
   d) a doped, vertical noncrystalline silicon resistor having a first and a second terminal, said first terminal being connected to said first terminal of said transistor with a first metal alloy interposed therebetween, and said second terminal being connected to a second bias voltage connection with another metal alloy interposed therebetween.

2. The circuit of claim 1, wherein said transistor is an NMOS transistor.

3. The circuit of claim 1, wherein said transistor is an NPN transistor.

4. A semiconductor memory cell comprising:
   a) a first transistor having a first, a second, and a third terminal;
   b) a second transistor having a first, a second, and a third terminal, said first terminal of said second transistor being coupled to said second terminal of said first transistor, said second terminal of said second transistor being coupled to said first terminal of said first transistor, and said third terminal of said second transistor being coupled to said third terminal of said first transistor;
   c) a first doped, vertical noncrystalline semiconductor resistor having a first and a second terminal, said first terminal being coupled to said first terminal of said first transistor with a first metal alloy interposed therebetween; and
   d) a second vertical noncrystalline semiconductor resistor having a first and a second terminal, said first terminal being coupled to said first terminal of said second transistor with another metal alloy interposed therebetween, and said second terminal being coupled to said second terminal of said first noncrystalline semiconductor resistor.

5. The memory cell of claim 4, wherein said first and second transistors are PMOS transistors.

6. The memory cell of claim 4, wherein said first and second transistors are PNP transistors.

7. The memory cell of claim 4, wherein said first and second vertical noncrystalline silicon resistors are doped vertical noncrystalline silicon resistors.

8. A semiconductor memory cell comprising:
   a first transistor having a first, a second, and a third terminal;
   a second transistor having a first, a second, and a third terminal, said first terminal of said second transistor being coupled to said second terminal of said first transistor, said second terminal of said second transistor being coupled to said first terminal of said first transistor, and said third terminal of said second transistor being coupled to said third terminal of said first transistor;
   a first doped, vertical noncrystalline silicon resistor having a first and a second terminal, said first terminal being coupled to said first terminal of said first transistor with a first metal alloy interposed therebetween; and
   a second doped vertical noncrystalline silicon resistor having a first and a second terminal, said first terminal being coupled to said first terminal of said second transistor with another metal alloy interposed therebetween, and said second terminal being coupled to said second terminal of said first noncrystalline semiconductor resistor.

* * * * *